United States Patent
Shen et al.

(10) Patent No.: US 7,700,973 B2
(45) Date of Patent: Apr. 20, 2010

(54) GAN/ALGAN/GAN DISPERSION-FREE HIGH ELECTRON MOBILITY TRANSISTORS

(75) Inventors: Likun Shen, Goleta, CA (US); Sten Johan Heikman, Goleta, CA (US); Umesh Kumar Mishra, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/962,911

(22) Filed: Oct. 12, 2004

(65) Prior Publication Data

US 2005/0077541 A1 Apr. 14, 2005

Related U.S. Application Data

(60) Provisional application No. 60/510,695, filed on Oct. 10, 2003.

(51) Int. Cl.
*H01L 29/778* (2006.01)
(52) U.S. Cl. .............. 257/194; 257/E29.246; 257/E29.252
(58) Field of Classification Search ........ 257/194, 257/192, E29.245–E29.253, 192.194; 438/172
See application file for complete search history.

(56) References Cited

U.S. PATENT DOCUMENTS 7,033,961 B1 * 4/2006 Smart et al. ............... 438/796

2003/0155578 A1 * 8/2003 Kohn et al. .................. 257/83
2003/0218183 A1 * 11/2003 Micovic et al. ............. 257/192
2004/0061129 A1 * 4/2004 Saxler et al. ................ 257/192
2005/0017317 A1 * 1/2005 Yao ........................... 257/439

OTHER PUBLICATIONS

Coffie et al. p-Capped GaN-AlGaN-GaN High-Electron Mobility Transistors (HEMTS). IEEE Electron Device Letters, vol. 23, No. 10, Oct. 2002.*
L Shen et al., "AlGaN/AlN/GaN High-Power Microwave HEMT", IEEE Electron Device Letters, vol. 22, No. 10, Oct. 2001, pp. 457-459.
Y.-F. Wu et al., "A 50-W AlGaN/GaN HEMT Amplifier", IEEE, 2000, (Document No. 0-7803-6438-4/00), 2pp.
N.-Q. Zhang et al., "High Breakdown GaN HEMT with Overlapping Gate Structure", IEEE Electron Device Letters, vol. 21, No. 9, Sep. 2000, pp. 421-423.

* cited by examiner

*Primary Examiner*—Allan R. Wilson
(74) *Attorney, Agent, or Firm*—Gates & Cooper LLP

(57) ABSTRACT

A dispersion-free high electron mobility transistor (HEMT), comprised of a substrate; a semi-insulating buffer layer, comprised of gallium nitride (GaN) or aluminum gallium nitride (AlGaN), deposited on the substrate, an AlGaN barrier layer, with an aluminum (Al) mole fraction larger than that of the semi-insulating buffer layer, deposited on the semi-insulating buffer layer, an n-type doped graded AlGaN layer deposited on the AlGaN barrier layer, wherein an Al mole fraction is decreased from a bottom of the n-type doped graded AlGaN layer to a top of the n-type doped graded AlGaN layer, and a cap layer, comprised of GaN or AlGaN with an Al mole fraction smaller than that of the AlGaN barrier layer, deposited on the n-type doped graded AlGaN layer.

15 Claims, 8 Drawing Sheets

GAN/ALGAN/GAN DISPERSION-FREE HIGH ELECTRON MOBILITY TRANSISTORS

CROSS-REFERENCE TO RELATED APPLICATIONS

This application claims the benefit under 35 U.S.C. §119 (e) of the following commonly-assigned U.S. Provisional Patent Application Ser. No. 60/510,695, entitled "GaN/AlGaN/GaN dispersion-free high electron mobility transistors," filed on Oct. 10, 2003, by Likun Shen, Sten J. Heikman and Umesh K. Mishra, which application is incorporated by reference herein.

STATEMENT REGARDING FEDERALLY SPONSORED RESEARCH AND DEVELOPMENT

This invention was made with Government support under Grant No. N00014-01-1-0764 awarded by the CANE MURI program. The Government has certain rights in this invention.

BACKGROUND OF THE INVENTION

1. Field of the Invention

This invention relates to semiconductor devices, and more particularly, to gallium nitride/aluminum gallium nitride/gallium nitride (GaN/AlGaN/GaN) dispersion-free high electron mobility transistors (HEMTs).

2. Description of the Related Art

GaN power HEMTs suffer from "DC-to-RF dispersion," which is defined as the difference between the static and dynamic (e.g. gate lag measurement) I-V characteristics. This dispersion has been reported to be due to the slow response of the surface traps. In the prior art, silicon nitride (SiN) passivation has been used to suppress this problem, but the drawback of SiN passivation is that it is very sensitive to both surface and deposition conditions, which leads to poor reproducibility.

What is needed, then, are improved methods of fabricating dispersion-free GaN-based HEMTs without SiN passivation.

SUMMARY OF THE INVENTION

To overcome the limitations in the prior art described above, and to overcome other limitations that will become apparent upon reading and understanding the present specification, the present invention discloses a dispersion-free high electron mobility transistor (HEMT), comprised of a substrate; a semi-insulating buffer layer, comprised of gallium nitride (GaN) or aluminum gallium nitride (AlGaN), deposited on the substrate, an AlGaN barrier layer, with an aluminum (Al) mole fraction larger than that of the semi-insulating buffer layer, deposited on the semi-insulating buffer layer, an n-type doped graded AlGaN layer deposited on the AlGaN barrier layer, wherein an Al mole fraction is decreased from a bottom of the n-type doped graded AlGaN layer to a top of the n-type doped graded AlGaN layer, and a cap layer, comprised of GaN or AlGaN with an Al mole fraction smaller than that of the AlGaN barrier layer, deposited on the n-type doped graded AlGaN layer.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

General Description

Figure 1:
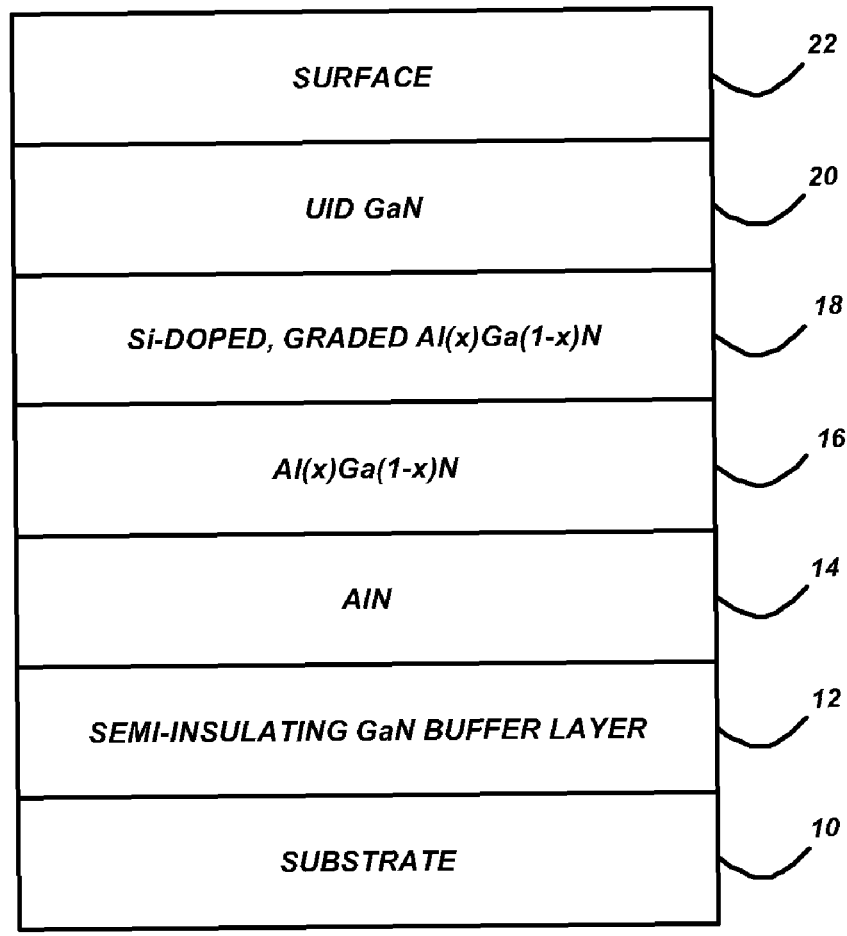
FIG. 1 is a schematic cross-section of a GaN/AlGaN/GaN HEMT.

The present invention uses an epitaxial solution to suppress the "DC-to-RF" dispersion problem suffered by GaN power HEMTs. This epitaxial solution results in the novel epitaxial structure of a GaN/AlGaN/GaN HEMT shown in FIG. 1, comprising a sapphire or silicon carbide (SiC) substrate 10, semi-insulating (S.I.) GaN buffer layer 12, AlN layer 14, $Al_xGa_{1-x}N$ layer 16, silicon-doped (Si-doped), graded $Al_xGa_{1-x}N$ layer 18, GaN cap 20 and surface 22.

In this structure, the GaN cap 20 is unintentionally doped (UID). The amount of dispersion depends on a ratio of a pinch-off voltage between the gate and access regions, wherein the pinch-off voltage is proportional to the distance between the channel and surface. Therefore, the GaN cap 20 needs to be a certain thickness to decrease dispersion to an acceptable level. For example, if dispersion needs to be less than 10%, the thickness of the GaN cap 20, therefore, should be at least 10 times as thick as the distance between the channel and metal gate.

The thickness of the Si-doped, graded AlGaN layer 18 is around 5-40 nm. The Al mole fraction varies linearly from 0 at the GaN 20/graded AlGaN 18 interface to the mole fraction of the adjacent AlGaN layer 16 at the graded AlGaN 18/AlGaN 16 interface. This layer 18 is uniformly doped by Si and doping density can be from 10% to 100% of the net polarization charge present in the graded AlGaN layer 18. The thickness of the AlGaN layer 16 is about 5-40 nm and the Al mole fraction can vary from a low of 5-10% to a high of 70-90%. The AlN layer 14 is 0.5-1 nm thick. The GaN buffer layer 12 is semi-insulating and 2-4 μm thick. The substrate 10 can be either sapphire or SiC.

Research has shown that the dispersion is caused by the slow response of the surface states at the drain access region. In order to decrease this effect, one solution is to increase the distance between the surface and channel so that the capacitance can be reduced. The ability of the surface states to modulate the channel decreases when this capacitance becomes smaller. Therefore, the thick GaN cap 20 in the access region reduces surface potential fluctuations from affecting device performance.

Figure 2:
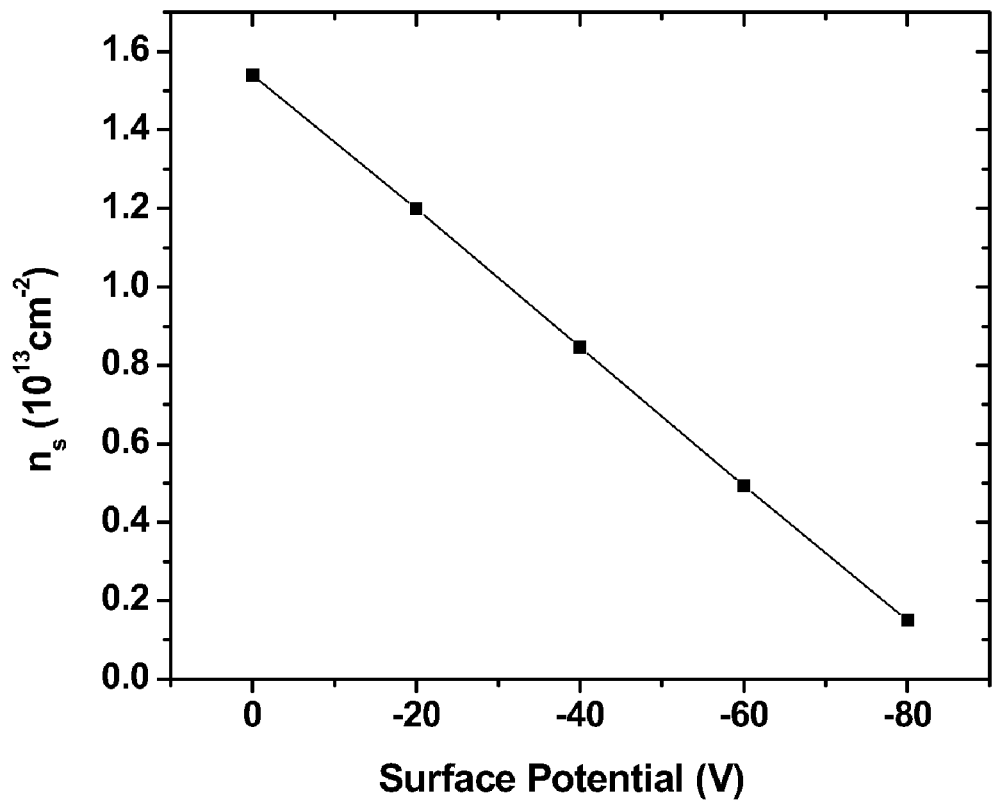
FIG. 2 is a graph that illustrates sheet charge density vs. surface potential of a GaN/AlGaN/GaN HEMT with a 250 nm GaN cap.

FIG. 2 illustrates sheet charge density vs. surface potential of the GaN/AlGaN/GaN HEMT with a 250 nm GaN cap. It can be seen that the channel is not depleted until −80 V, which is much larger than that of conventional AlGaN/GaN HEMT (about −10 V). This is the key element in the present invention to implement dispersion-free GaN HEMTs. The Si-doping of the graded AlGaN layer 18 is used to remove hole accumulation in said graded layer. A thin AlN layer is inserted to improve mobility.

The processing is similar to that of conventional HEMTs, except that deep etching is necessary for both the source/drain contact and gate, in order to obtain ohmic contacts, reasonable transconductance and pinch-off voltage.

Figure 3:
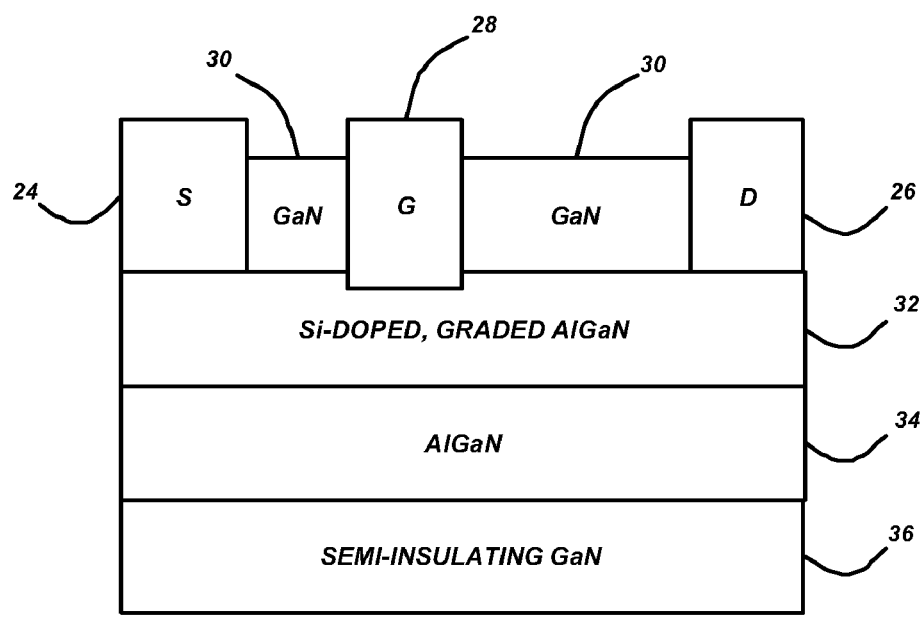
FIG. 3 is a schematic cross-section of a GaN/AlGaN/GaN HEMT.

FIG. 3 is a schematic cross-section of a GaN/AlGaN/GaN HEMT. This figure illustrates source (S) 24, drain (D) 26 and gate (G) 28 contacts, GaN layer 30, Si-doped, graded AlGaN layer 32, AlGaN layer 34 and semi-insulating (S.I.) GaN layer 36. The n-type doped graded AlGaN layer 32 includes a recess in a gate region of the device, wherein the gate contact 28 is formed in the recess in the gate region of the n-type doped graded AlGaN layer. The source contact 24 and the drain contact 26 are formed on the n-type doped graded AlGaN layer 32 on opposite sides of the gate region.

Figure 4A:
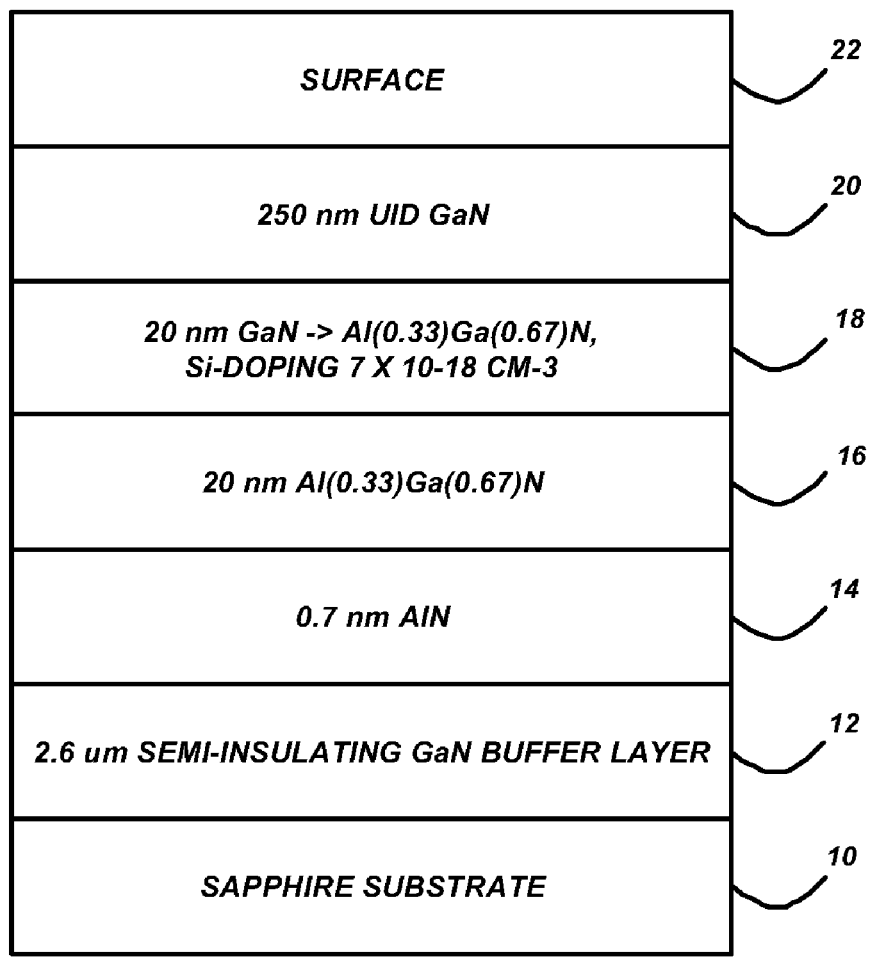
FIG. 4A is a schematic cross-section of a GaN/AlGaN/GaN HEMT.
Figure 4B:
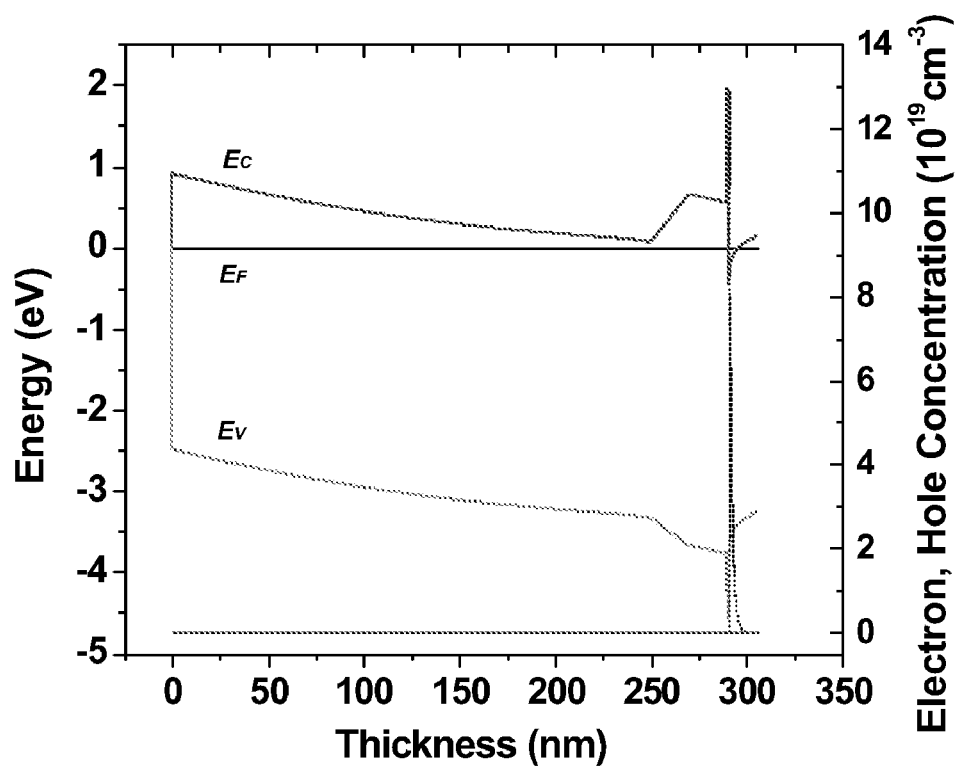
FIG. 4B is a graph that illustrates a band diagram of a GaN/AlGaN/GaN HEMT.

One sample with this structure was grown and fabricated. FIG. 4A shows the details of the epitaxial structure and FIG. 4B shows the band diagram of a GaN/AlGaN/GaN HEMT.

Figure 5:
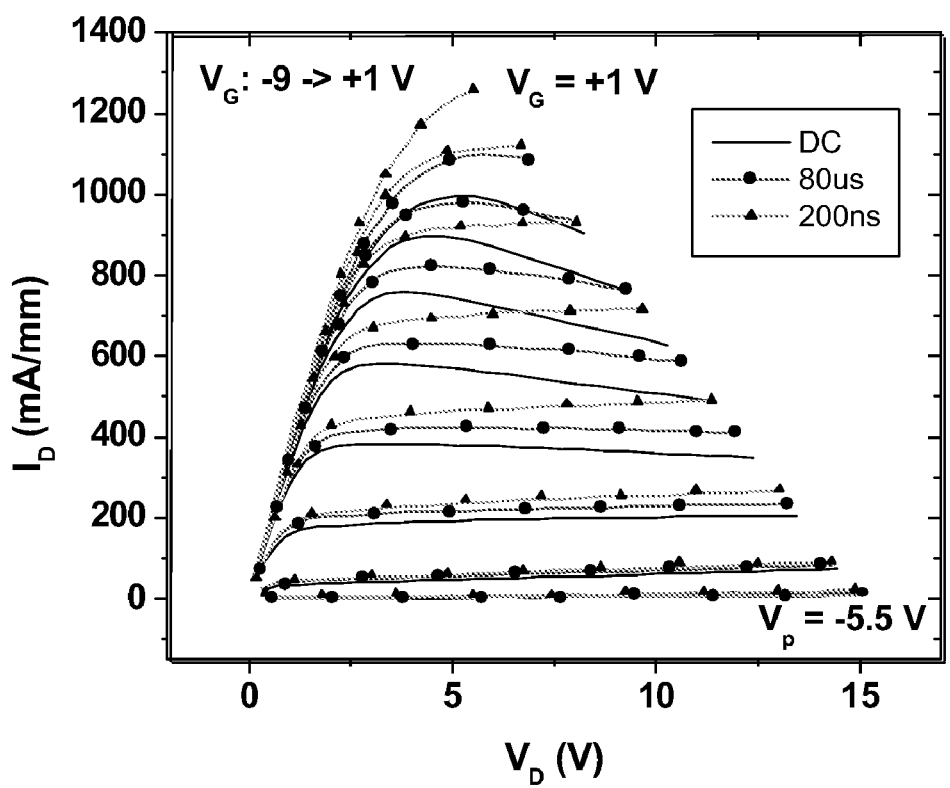
FIG. 5 is a graph that illustrates DC and Pulsed I-V curves.
Figure 6:
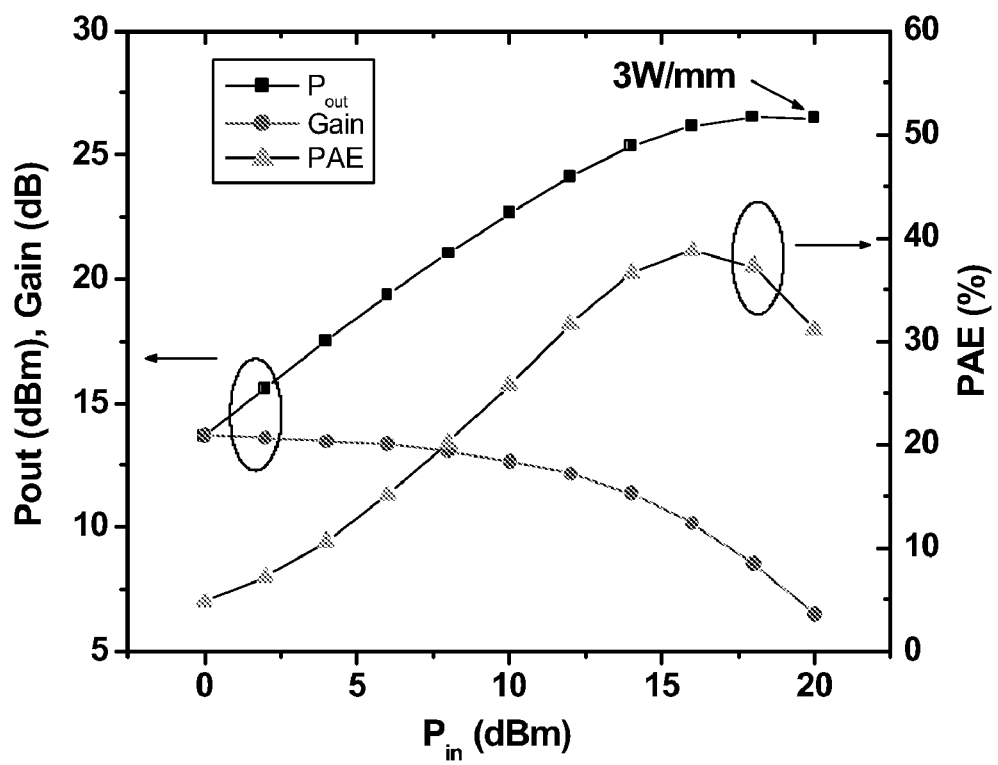
FIG. 6 is a graph that illustrates power performance at 8 GHz of 15 V drain bias.

The DC and gate lag pulsed I-V characteristics of the unpassivated sample were measured. No dispersion was observed up to 200 ns, as shown in FIG. 5. At 200 ns, current density of 1.25 A/mm and transconductance of 230 mS/mm were obtained. Small signal RF performance showed 22 GHz $f_t$ and 40 GHz $f_{max}$ for 0.7 μm-gate-length device. Power measurement of the unpassivated sample at 8 GHz showed 2 W/mm and 3 W/mm with a PAE (power added efficiency) of 42% and 38% at a drain bias of 10 V and 15 V, respectively, as shown in FIG. 6. This indicates that the dispersion is suppressed even in the GHz range.

Process Steps

Figure 7:
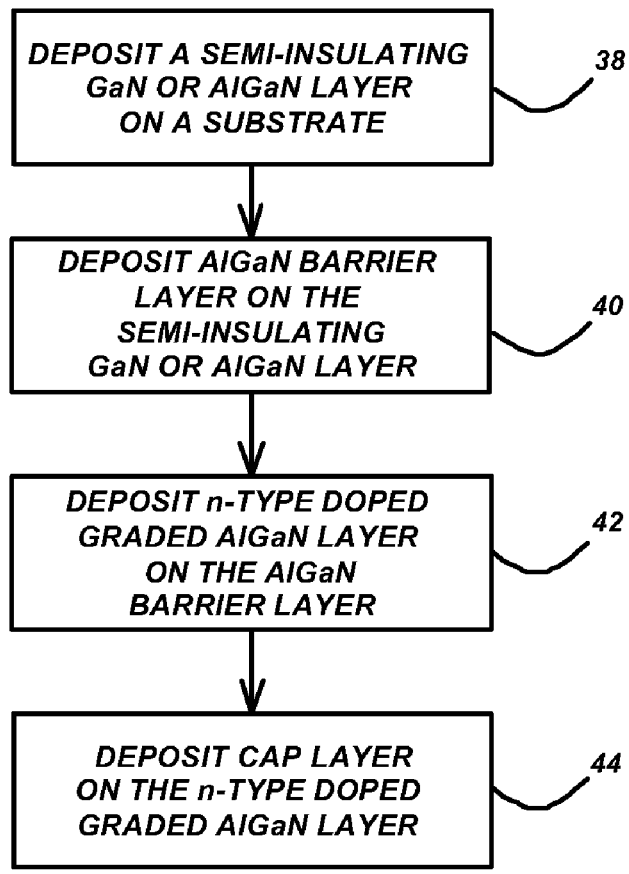
FIG. 7 is a flowchart that illustrates the steps for fabricating a dispersion-free HEMT, according to the preferred embodiment of the present invention.

FIG. 7 is a flowchart that illustrates the steps for fabricating a dispersion-free HEMT, according to the preferred embodiment of the present invention.

Block 38 represents depositing a semi-insulating buffer layer, comprised of gallium nitride (GaN) or aluminum gallium nitride (AlGaN), on a substrate, wherein the substrate is sapphire or silicon carbide.

Block 40 represents depositing an AlGaN barrier layer, with an aluminum (Al) mole fraction larger than that of the semi-insulating buffer layer, on the semi-insulating buffer layer. Note that this Block may also place a thin aluminum nitride (AlN) layer between the semi-insulating buffer layer and the AlGaN barrier layer.

Block 42 represents depositing an n-type doped graded AlGaN layer on the AlGaN barrier layer, wherein the Al mole fraction is decreased from the bottom of the layer to the top of the layer. Specifically, the Al mole fraction in the n-type doped graded AlGaN layer is varied through the layer, such that the Al mole fraction in the n-type doped graded AlGaN layer next to the AlGaN barrier layer equals the Al mole fraction of the AlGaN barrier layer, and that the Al mole fraction in the n-type doped graded AlGaN layer next to the cap layer equals the Al mole fraction of the cap layer.

Block 44 represents depositing a cap layer, comprised of GaN or AlGaN with an Al mole fraction smaller than that of the AlGaN barrier layer, on the n-type doped graded AlGaN layer. As a result of this Block, the cap layer and the n-type doped graded AlGaN layer separate a channel from the HEMT's surface in an access region to minimize surface potential fluctuations from affecting device performance.

Moreover, the n-type doped graded AlGaN layer prevents hole accumulation at an interface between the cap layer and the AlGaN barrier layer.

Possible Modifications

Possible modifications include:

1. The structure has a low Al mole fraction AlGaN cap layer instead of GaN cap layer.

2. The graded AlGaN region is removed, thus there is abrupt GaN/AlGaN interface, instead of a graded junction.

3. The n-type doping is performed with other shallow donor element than Si.

4. The graded AlGaN layer has a non-linear change in Al composition over a distance.

5. Part/parts of the distance during which the Al composition is changed are undoped.

6. The n-type doping in the graded AlGaN region is not uniform.

7. One or more parts of the UID GaN cap are doped by n-type or p-type dopants.

8. Instead of a plain GaN cap, there can be another heterojunction (e.g. AlGaN/GaN to form another 2DEG channel) to screen surface potential fluctuation further.

9. The GaN cap and the graded AlGaN layer can be replaced by a thick, graded AlGaN layer, wherein the thickness of the graded AlGaN is similar to the thickness of the GaN cap, to screen the surface potential fluctuation.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A high electron mobility transistor (HEMT), comprising:
   a substrate;
   a semi-insulating buffer layer, comprised of gallium nitride (GaN) or aluminum gallium nitride (AlGaN), deposited on the substrate;
   an AlGaN barrier layer, with an aluminum (Al) mole fraction larger than that of the semi-insulating buffer layer, deposited on the semi-insulating buffer layer;
   an n-type doped graded AlGaN layer deposited on the AlGaN barrier layer, wherein an Al mole fraction is decreased from a bottom of the n-type doped graded AlGaN layer to a top of the n-type doped graded AlGaN layer and the n-type doped graded AlGaN layer includes a recess in a gate region of the HEMT;
   a source contact and a drain contact formed on the n-type doped graded AlGaN layer on opposite sides of the gate region;
   a gate contact formed in the recess in the gate region of the n-type doped graded AlGaN layer; and
   a cap layer, comprised of GaN or AlGaN with an Al mole fraction smaller than that of the AlGaN barrier layer, deposited on the n-type doped graded AlGaN layer in an access region between the source contact and the gate contact and between the drain contact and the gate contact;

wherein a thickness of the cap layer as compared to a distance between a channel and the gate contact is such that dispersion is less than 10%.

2. The HEMT of claim 1, wherein the n-type doped graded AlGaN layer prevents hole accumulation at an interface between the cap layer and the AlGaN barrier layer.

3. The HEMT of claim 1, wherein the Al mole fraction in the n-type doped graded AlGaN layer is varied through the n-type doped graded AlGaN layer, such that the Al mole fraction in the n-type doped graded AlGaN layer next to the AlGaN barrier layer equals the Al mole fraction of the AlGaN barrier layer, and that the Al mole fraction in the n-type doped graded AlGaN layer next to the cap layer equals the Al mole fraction of the cap layer.

4. The HEMT of claim 1, wherein the substrate is sapphire or silicon carbide.

5. The HEMT of claim 1, wherein a thin aluminum nitride (AlN) layer is placed between the semi-insulating buffer layer and the AlGaN barrier layer.

6. The HEMT of claim 1, wherein the thickness of the cap layer is at least 250 nm.

7. The HEMT of claim 1, wherein the thickness of the cap layer is at least 10 times the distance between the channel and the gate.

8. The HEMT of claim 1, wherein the cap layer in the access region between the gate contact and the drain contact is adjacent to the gate contact.

9. The HEMT of claim 1, wherein the thickness of the cap layer is such that the channel is not depleted until a surface potential of −80 V.

10. A high electron mobility transistor (HEMT), comprising:
a substrate;
a semi-insulating buffer layer, comprised of gallium nitride (GaN) or aluminum gallium nitride (AlGaN), deposited on the substrate;
an AlGaN barrier layer, with an aluminum (Al) mole fraction larger than that of the semi-insulating buffer layer, deposited on the semi-insulating buffer layer; and
an n-type doped graded AlGaN layer, deposited on the AlGaN barrier layer, wherein the aluminum mole fraction is decreased from the bottom of the n-type doped graded AlGaN layer to the top of the n-type doped graded AlGaN layer,
wherein a thickness of the n-type doped graded AlGaN layer, in an access region between a source contact and a gate contact and between a drain contact and the gate contact, as compared to a distance between a channel and the gate contact is such that dispersion is less than 10%.

11. The HEMT of claim 10, wherein the n-type doping of the n-type doped graded AlGaN layer prevents hole accumulation in the n-type doped graded AlGaN layer or in the AlGaN barrier layer.

12. The HEMT of claim 10, wherein the Al mole fraction in the n-type doped graded AlGaN layer is varied through the n-type doped graded AlGaN layer, such that the Al mole fraction in the n-type doped graded AlGaN layer next to the AlGaN barrier layer equals the Al mole fraction of the AlGaN barrier layer, and that the Al mole fraction at the top of the n-type doped graded AlGaN layer is less than 0.10.

13. The HEMT of claim 10, wherein the substrate is sapphire or silicon carbide.

14. The HEMT of claim 10, wherein a thin aluminum nitride (AlN) layer is placed between the semi-insulating buffer layer and the AlGaN barrier layer.

15. A high electron mobility transistor (HEMT), comprising:
a substrate;
a semi-insulating buffer layer, comprised of gallium nitride (GaN) or aluminum gallium nitride (AlGaN), deposited on the substrate;
an AlGaN barrier layer, with an aluminum (Al) mole fraction larger than that of the semi-insulating buffer layer, deposited on the semi-insulating buffer layer;
an unintentionally doped cap layer, comprised of GaN or AlGaN with an Al mole fraction smaller than that of the AlGaN barrier layer, deposited on the AlGaN barrier layer; and
an n-type doping region between the cap layer and the AlGaN barrier layer;
wherein a thickness of the cap layer, the n-type doping region and the AlGaN barrier layer, in an access region between a source contact and a gate contact and between a drain contact and the gate contact, as compared to a distance between a channel and the gate contact is such that dispersion is less than 10%.

* * * * *